United States Patent
Blonder et al.

(10) Patent No.: US 7,633,093 B2
(45) Date of Patent: Dec. 15, 2009

(54) METHOD OF MAKING OPTICAL LIGHT ENGINES WITH ELEVATED LEDS AND RESULTING PRODUCT

(75) Inventors: Greg Blonder, Summit, NJ (US); Shane Harrah, Moorestown, NJ (US)

(73) Assignee: Lighting Science Group Corporation, Satellite Beach, FL (US)

( * ) Notice: Subject to any disclaimer, the term of this patent is extended or adjusted under 35 U.S.C. 154(b) by 180 days.

(21) Appl. No.: 11/343,986

(22) Filed: Jan. 31, 2006

(65) Prior Publication Data

US 2006/0186423 A1 Aug. 24, 2006

Related U.S. Application Data

(63) Continuation-in-part of application No. 10/638,579, filed on Aug. 11, 2003, now Pat. No. 7,095,053.

(60) Provisional application No. 60/467,857, filed on May 5, 2003.

(51) Int. Cl.
*H01L 33/00* (2006.01)

(52) U.S. Cl. .............................. 257/81; 257/13; 257/79; 257/80; 257/82; 257/85; 257/90; 257/91; 257/98; 257/99; 257/103; 257/918; 257/E51.018; 257/E51.022; 257/E33.001; 257/E33.007; 257/E25.032

(58) Field of Classification Search .................. 257/13, 257/79–103, 918, E51.018, E51.022, E33.001, 257/E33.007, E25.032
See application file for complete search history.

(56) References Cited

U.S. PATENT DOCUMENTS

| | | | |
|---|---|---|---|
| 3,711,789 A | 1/1973 | Dierschke | |
| 4,886,709 A | 12/1989 | Sasame et al. | |
| 4,902,567 A | 2/1990 | Eilertsen et al. | |
| 4,935,655 A | 6/1990 | Ebner | |
| 5,117,281 A | 5/1992 | Katsuraoka | |
| 5,122,781 A | 6/1992 | Saubolle | |
| 5,140,220 A | 8/1992 | Hasegawa | |
| 5,235,347 A * | 8/1993 | Lee ............................ | 347/238 |
| 5,441,774 A | 8/1995 | Dutta et al. | |
| 5,482,898 A | 1/1996 | Marrs | |
| 5,485,037 A | 1/1996 | Marrs | |
| 5,581,876 A | 12/1996 | Prabhu et al. | |

(Continued)

FOREIGN PATENT DOCUMENTS

DE 19625622 1/1998

(Continued)

*Primary Examiner*—Wael Fahmy
*Assistant Examiner*—Marc Armand
(74) *Attorney, Agent, or Firm*—Cantor Colburn LLP

(57) ABSTRACT

An optical light engine is fabricated by providing a thermally conductive base having one or more mounting pedestals for elevating one or more LED die above the base's surface. The LED die are mounted on the pedestals, electrically connected, and a mold having a molding surface for molding a dome centered around the LED die is disposed on the base over the pedestal-mounted LED die. The encapsulating material is then injected through an input port disposed in the base to mold the dome around the LED die. The encapsulant material is cured and the mold is removed. In an advantageous embodiment, the light engine comprises a ceramic-coated metal base made by the low temperature co-fired ceramic-on-metal process (LTCC-M).

26 Claims, 6 Drawing Sheets

U.S. PATENT DOCUMENTS

| | | | |
|---|---|---|---|
| 5,660,461 A | 8/1997 | Ignatius et al. | |
| 5,674,554 A | 10/1997 | Liu et al. | |
| 5,725,808 A | 3/1998 | Tormey et al. | |
| 5,745,624 A | 4/1998 | Chan et al. | |
| 5,841,244 A | 11/1998 | Hamilton et al. | |
| 5,847,507 A | 12/1998 | Butterworth et al. | |
| 5,847,935 A | 12/1998 | Thaler et al. | |
| 5,857,767 A | 1/1999 | Hochstein | |
| 5,908,155 A | 6/1999 | Duffy et al. | |
| 5,953,203 A | 9/1999 | Tormey et al. | |
| 5,959,316 A | 9/1999 | Lowery | |
| 5,977,567 A | 11/1999 | Verdiell | |
| 5,998,925 A | 12/1999 | Shimizu et al. | |
| 6,016,038 A | 1/2000 | Mueller et al. | |
| 6,045,240 A | 4/2000 | Hochstein | |
| 6,066,861 A | 5/2000 | Hohn et al. | |
| 6,069,440 A | 5/2000 | Shimizu et al. | |
| 6,137,224 A * | 10/2000 | Centofante | 313/510 |
| 6,220,722 B1 | 4/2001 | Begemann | |
| 6,224,216 B1 | 5/2001 | Parker et al. | |
| 6,245,259 B1 | 6/2001 | Hohn et al. | |
| 6,259,846 B1 | 7/2001 | Roach et al. | |
| 6,277,301 B1 | 8/2001 | Hohn et al. | |
| 6,318,886 B1 | 11/2001 | Stopa et al. | |
| 6,325,524 B1 | 12/2001 | Weber et al. | |
| 6,376,268 B1 | 4/2002 | Verdiell | |
| 6,417,019 B1 | 7/2002 | Mueller et al. | |
| 6,428,189 B1 | 8/2002 | Hochstein | |
| 6,455,930 B1 | 9/2002 | Palanisamy et al. | |
| 6,478,402 B1 | 11/2002 | Greive et al. | |
| 6,480,389 B1 * | 11/2002 | Shie et al. | 361/707 |
| 6,483,623 B1 | 11/2002 | Maruyama | |
| 6,498,355 B1 * | 12/2002 | Harrah et al. | 257/99 |
| 6,517,218 B2 | 2/2003 | Hochstein | |
| 6,518,502 B2 | 2/2003 | Hammond et al. | |
| 6,565,239 B2 | 5/2003 | Rizkin et al. | |
| 6,576,488 B2 | 6/2003 | Collins, III et al. | |
| 6,576,930 B2 | 6/2003 | Reeh et al. | |
| 6,577,073 B2 | 6/2003 | Shimizu et al. | |
| 6,592,780 B2 | 7/2003 | Hohn et al. | |
| 6,608,332 B2 | 8/2003 | Shimizu et al. | |
| 6,613,247 B1 | 9/2003 | Hohn et al. | |
| 6,614,179 B1 | 9/2003 | Shimizu et al. | |
| 6,622,948 B1 | 9/2003 | Haas et al. | |
| 6,627,115 B2 | 9/2003 | Hampden-Smith et al. | |
| 6,630,691 B1 | 10/2003 | Mueller-Mach et al. | |
| 6,634,750 B2 | 10/2003 | Neal et al. | |
| 6,634,770 B2 | 10/2003 | Cao | |
| 6,670,751 B2 | 12/2003 | Song et al. | |
| 6,682,207 B2 | 1/2004 | Weber et al. | |
| 6,692,252 B2 | 2/2004 | Scott | |
| 6,727,643 B2 | 4/2004 | Suehiro et al. | |
| 6,734,465 B1 | 5/2004 | Taskar et al. | |
| 6,747,293 B2 | 6/2004 | Nitta et al. | |
| 6,791,119 B2 | 9/2004 | Slater, Jr. et al. | |
| 6,793,374 B2 | 9/2004 | Begemann | |
| 6,812,500 B2 | 11/2004 | Reeh et al. | |
| 6,831,302 B2 | 12/2004 | Erchak et al. | |
| 6,833,669 B2 | 12/2004 | George et al. | |
| 6,866,394 B1 | 3/2005 | Hutchins et al. | |
| 6,874,910 B2 * | 4/2005 | Sugimoto et al. | 362/294 |
| 6,943,380 B2 | 9/2005 | Ota et al. | |
| 6,964,877 B2 | 11/2005 | Chen et al. | |
| 6,982,829 B1 | 1/2006 | Berman | |
| 7,235,189 B2 | 6/2007 | Hohn et al. | |
| 7,276,736 B2 | 10/2007 | Hohn et al. | |
| 2001/0030326 A1 | 10/2001 | Reeh et al. | |
| 2001/0032985 A1 | 10/2001 | Bhat et al. | |
| 2002/0004251 A1 | 1/2002 | Roberts et al. | |
| 2002/0034834 A1 | 3/2002 | Verdiell | |
| 2002/0163006 A1 * | 11/2002 | Yoganandan et al. | 257/81 |
| 2002/0175621 A1 | 11/2002 | Song et al. | |
| 2002/0176250 A1 | 11/2002 | Bohler et al. | |
| 2003/0010993 A1 | 1/2003 | Nakamura et al. | |
| 2003/0025465 A1 | 2/2003 | Swanson et al. | |
| 2003/0057421 A1 | 3/2003 | Chen | |
| 2003/0077385 A1 | 4/2003 | Ainsworth et al. | |
| 2003/0156608 A1 * | 8/2003 | Ido et al. | 372/38.1 |
| 2003/0193055 A1 | 10/2003 | Martter et al. | |
| 2004/0026706 A1 | 2/2004 | Bogner et al. | |
| 2004/0150995 A1 | 8/2004 | Coushaine et al. | |
| 2004/0222433 A1 | 11/2004 | Mazzochette et al. | |
| 2004/0223315 A1 | 11/2004 | Suehiro et al. | |
| 2004/0233672 A1 | 11/2004 | Dubuc | |
| 2005/0029535 A1 | 2/2005 | Mazzochette et al. | |
| 2005/0088625 A1 | 4/2005 | Imade | |
| 2005/0168147 A1 | 8/2005 | Innocenti et al. | |
| 2005/0189557 A1 | 9/2005 | Mazzochette et al. | |
| 2005/0225222 A1 | 10/2005 | Mazzochette et al. | |
| 2005/0270666 A1 | 12/2005 | Loh et al. | |
| 2006/0006405 A1 | 1/2006 | Mazzochette | |
| 2006/0105484 A1 | 5/2006 | Basin et al. | |

FOREIGN PATENT DOCUMENTS

| | | |
|---|---|---|
| DE | 19638667 | 4/1998 |
| EP | 0862794 | 9/1998 |
| EP | 0936682 | 8/1999 |
| EP | 1017112 | 7/2000 |
| EP | 1221724 | 7/2002 |
| JP | 10-012926 | 1/1998 |
| JP | 2000-294701 | 10/2000 |
| WO | WO-97/50132 | 12/1997 |
| WO | WO-98/05078 | 2/1998 |
| WO | WO-98/12757 | 3/1998 |

* cited by examiner

METHOD OF MAKING OPTICAL LIGHT ENGINES WITH ELEVATED LEDS AND RESULTING PRODUCT

CROSS REFERENCE TO RELATED APPLICATIONS

This application is a continuation-in-part of U.S. patent application Ser. No. 10/638,579, filed on Aug. 11, 2003 now U.S. Pat. No. 7,095,053, which claims the benefit of U.S. Provisional Application Ser. No. 60/467,857, filed on May 5, 2003. The entire disclosures of U.S. patent application Ser. No. 10/638,579 and U.S. Provisional Application Ser. No. 60/467,857 are incorporated by reference herein.

FIELD OF THE INVENTION

This invention relates to optical light engines and, in particular, to a method of making a light engine with one or more light emitting diode (LED) elevated above a supporting substrate for increased efficiency.

BACKGROUND OF THE INVENTION

Optical light engines using light emitting diodes offer considerable promise for a wide variety of applications. LED light engines integrate LED packaging with optical elements to provide maximum light output within a preselected illumination cone. Conventional LED light engines provide attractive alternatives to conventional halogen and incandescent bulbs in many applications, such as, for example, specialty illumination, display illumination, medical illumination and image projection.

One approach to fabricating LED light engines is to provide a base having a surface cavity, mounting one or more LED die in the cavity, and forming a lens structure encapsulating the LED die. FIG. 1 illustrates a light engine 10 produced according to the described process. As shown in FIG. 1, one or more LED die 11 are disposed on a base 12 within a surface cavity 13. The LED die 11 are electrically connected, using, for example, one or more bonding wires 16, and encapsulated in a lens of transparent material, such as an epoxy dome 14.

Unfortunately, the disposition of the LED die 11 in surface cavity 13 reduces the amount of light that can be extracted from the LED die 11. Since the LED die 11 emit light from each side, one or more walls 15 of the surface cavity 13 accept and absorb some of the side light emitted by each LED die 11, thus resulting in a reduction of the total flux emitted by the light engine 10. Moreover, the epoxy dome 14 is typically formed by injecting an epoxy into the cavity, using, for example, a syringe. This process, however, forms a dome having a hemispherical shape with a center that is typically spaced above the underlying LED die 11. Therefore, the LED die 11 is spaced away from the optimal center position, further reducing the efficiency of the light extraction.

One approach to increasing the extraction efficiency is to mount the LED die on a pedestal rising from the base, and to form a dome lens centered around the LED die. This approach has been implemented by placing a hollow plastic dome centered around a pedestal-mounted LED die and filling the plastic dome with silicone gel. A multi-step assembly process is required which includes the picking up and positioning of the hollow-dome, followed by the filling of the dome with silicone gel. This approach, however, is time-consuming and leads to increased manufacturing costs. Accordingly there is a need for an improved method of making an optical light engine including one or more elevated LED die.

SUMMARY OF THE INVENTION

The above-described problem is addressed and a technical solution is achieved in the art by a method of fabricating an optical light engine having one or more elevated LED die. According to an embodiment of the present invention, an optical light engine is fabricated by providing a thermally conductive base having one or more mounting pedestals for elevating one or more LED die above a surface of the conductive base. The conductive base may also include at least two port openings, wherein at least one opening is an input port adapted for the injection of the encapsulating material, and wherein at least one opening is an output port adapted for the removal of the overflow encapsulating material.

According to an embodiment of the present invention, the LED die are mounted on the pedestals. Next, a mold having a molding surface for molding a dome centered around the LED die is disposed on the base over the pedestal-mounted LED die. A transparent encapsulant, such as silicone, is then injected through an input port into the mold to form a dome centered around the LED die. The encapsulant is cured and the mold is removed. According to a preferred embodiment of the present invention, the light engine comprises a ceramic-coated metal base made by a low temperature co-fired ceramic-on-metal process (LTCC-M).

BRIEF DESCRIPTION OF THE DRAWINGS

The advantages, nature and various additional features of the invention will appear more fully upon consideration of the illustrative embodiments now to be described in detail in connection with the accompanying drawings. In the drawings.

It is to be understood that the drawings are to explain the concepts of the invention and may not be to scale.

DETAILED DESCRIPTION OF THE DRAWINGS

This description is divided into two parts. Part I describes a method for making an optical light engine with elevated LEDs, and Part II describes the fabrication of exemplary LTCC-M mounting structures suitable for use in conjunction with an embodiment of the process described in Part I.

I. Method of Making an Optical Light Engine Including Elevated LEDs

Figure 1:
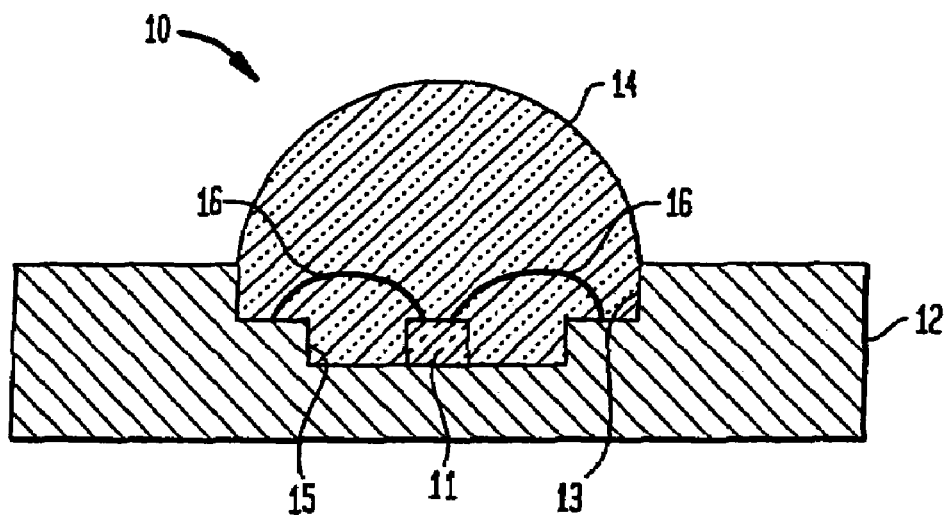
FIG. 1 is a schematic cross section of a conventional optical light engine.
Figure 2:
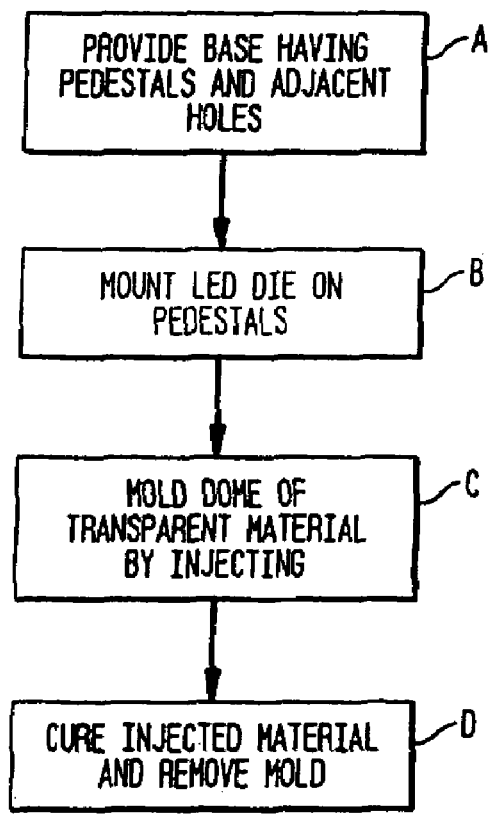
FIG. 2 is a diagram depicting steps involved in a method of fabricating a masked optical light engine, in accordance with an embodiment of the present invention.

Referring to the drawings, FIG. 2 is a schematic flow diagram showing an exemplary process for making an optical light engine having one or more elevated LEDs, according to an embodiment of the present invention. As shown in Block A, a first step is to provide a mounting structure for the LED die. According to an embodiment of the present invention, the mounting structure may include a base having a surface and one or more mounting pedestals for receiving one or more respective LEDs at positions elevated at least as high as the base surface. Optionally, the base includes a metal layer supporting a ceramic layer or coat. Advantageously, the ceramic coated metal may be fabricated according to a LTCC-M method, as described in detail below. Optionally, the mounting pedestals are high thermal conductivity metal posts that extend through openings in the ceramic and attach to the base.

According to an embodiment of the present invention, the mounting pedestals may extend above the surface of the metal base. According to another embodiment of the present invention, the one or more mounting pedestals may extend at least as high as a top surface of the overlying ceramic. The base may further include at least two holes, preferably located adjacent to each pedestal, wherein at least one hole operates as an input port for the injection of a material suitable for the formation of a dome-like lens, and wherein at least one port operates as an overflow conduit for the removal of any excess material.

According to an embodiment of the present invention, the next step, shown in Block B of FIG. 2, involves the mounting of one or more LED die on each mounting pedestal. In addition to securing the LED die on the mounting pedestal, the LED die may be connected to conductive paths to power and control circuitry. One having ordinary skill in the art will appreciate that the LED die may be connected to the conductive paths using any suitable connecting means, such as, for example, wire bonds.

The third step (Block C) involves molding one or more domes of a transparent encapsulating material over the mounted LED die. According to an embodiment of the present invention, the dome is substantially centered around the LED die. For example, for a pedestal with a single LED die, the LED die is preferably positioned at or near the radial center of a hemispheric dome.

According to an embodiment of the present invention, the molding is advantageously effected by disposing over the mounted LED die and sealing against the base, a mold having a molding surface configured to mold the domes. A suitable transparent material may be injected into the mold through one of the associated ports, with excess material, or overflow, exiting through the other port. One having ordinary skill in the art will appreciate that, for an array of elevated LED die, the molding surface may be configured to mold a corresponding array of domes.

In the final step, represented by Block D in FIG. 2, the injected material is cured and the mold is removed. The resulting one or more domes may be substantially centered around the mounting pedestals and the LED die.

Figure 3:
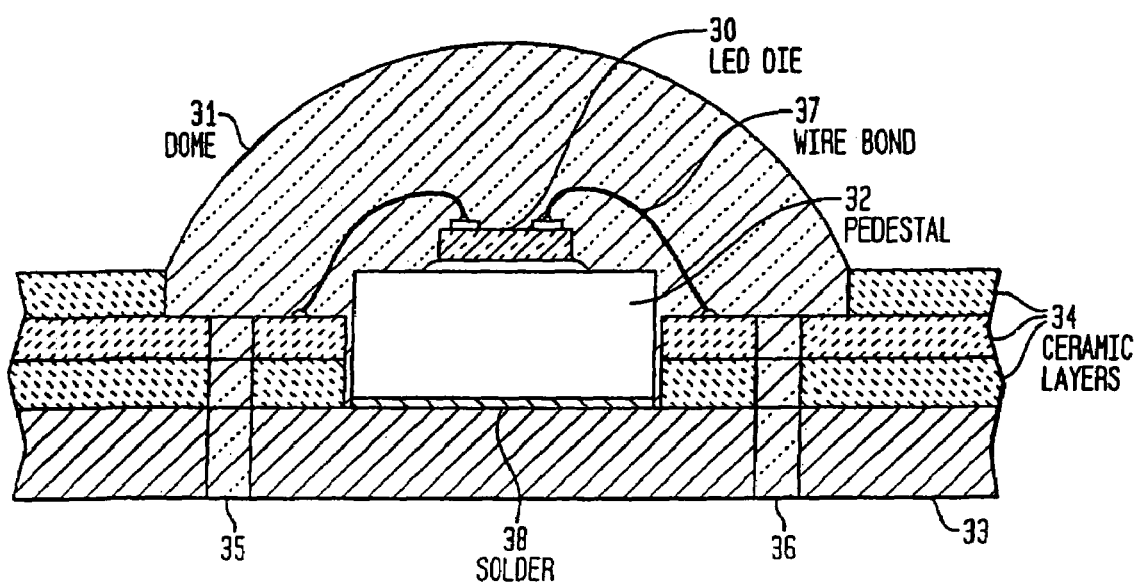
FIG. 3 illustrates an exemplary optical light engine, fabricated according to an embodiment of the present invention.

FIG. 3 illustrates an exemplary embodiment of an optical light engine made by the method illustrated in FIG. 2 and described in detail above. According to this embodiment, an LED die 30, having a bottom surface, is elevated to approximately the center of a dome 31 using a mounting pedestal 32. According to an embodiment of the present invention, the mounting pedestal 32 may be thermally coupled to the base metal 33 of a LTCC-M ceramic-on-metal substrate, using, for example a solder 38 or a silver-filled epoxy. Optionally, the base metal 33 may be coated with one or more layers of ceramic coating 34. One having ordinary skill in the art will appreciate that by elevating the LED die 30 at or near the center of the dome 31, as shown in FIG. 3, the optical efficiency of the light engine is improved, particularly when the light engine interfaces to produce a Lambertian radiation pattern.

Advantageously, the mounting pedestal 32 may be adapted to operate as a heat spreader. For example, the mounting pedestal 32 may be comprised of thermally conductive metal, such as, for example, Cu/Mo/Cu (i.e., a material which has a coefficient of thermal expansion (CTE) similar to the LED die 30). Optionally, the mounting pedestal 32 may be provided with a reflective metal surface, such as, for example, plated silver or a sputtered aluminum (not shown).

The dome 31, suitable for use with a Lambertian radiation source, may be hemispherical in shape, although one having ordinary skill in the art will appreciate that other shapes may be used in accordance with the present invention. The dome 31 may be formed by a casting or transfer-molding process, using an input port 35 for the injection of a molding material (e.g., silicone or epoxy) and an output port 36 for accepting the overflow of the molding material. Preferably, the input and output ports 35, 36 are located adjacent the mounting pedestal 32 and below each dome 31. One having ordinary skill in the art will appreciate that other transparent molding materials, such as, for example, clear epoxy, may be used to encapsulate each LED die 30 and form each dome 31.

Optionally, the LED die 30 may be electrically connected to metallization (not shown) disposed on the ceramic layer 34, using a suitable connection means, such as, for example, wire bonds 37.

Figure 4:
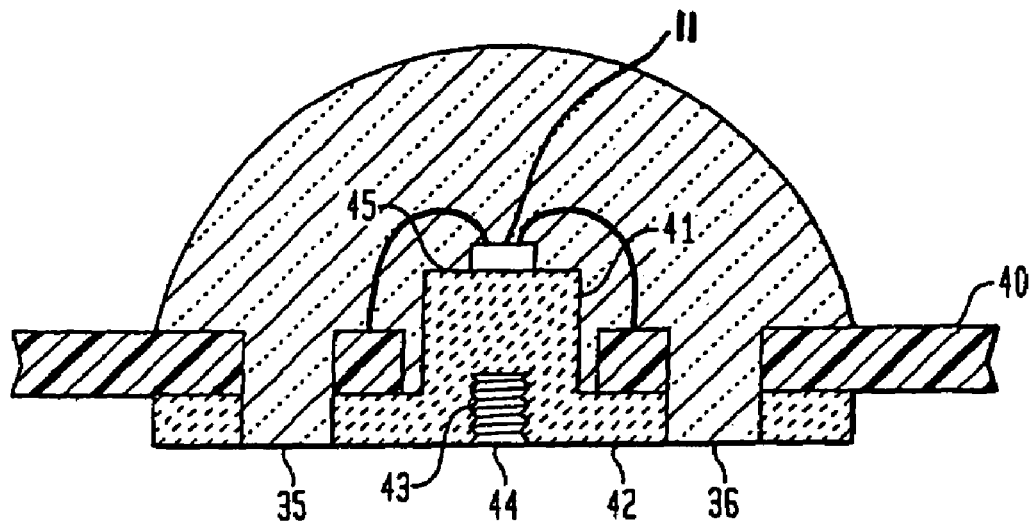
FIG. 4 illustrates an exemplary optical light engine fabricated according to an embodiment of the present invention.

FIG. 4 depicts an embodiment of a light engine made according to the process illustrated in FIG. 2 and described in detail above. According to this embodiment of the present invention, the light engine includes a base 40 comprising a printed wiring board (e.g., a FR4 material), rather than a ceramic metal substrate. The mounting pedestal 41 may be arranged as a projection from a metal heat spreader or heat sink 42 disposed in or at least partially underneath the base 40. One having ordinary skill in the art will appreciate that the heat sink 42 may be composed of any suitable material, such as, for example, Al, Cu or Cu/Mo/Cu. As shown in FIG. 4, the mounting pedestal 41 extends through an opening in the base 40. The mounting pedestal 41 according to this embodiment may be composed of a suitable heat sinking material capable of managing the heat generated by the LED die 11.

Figure 7:
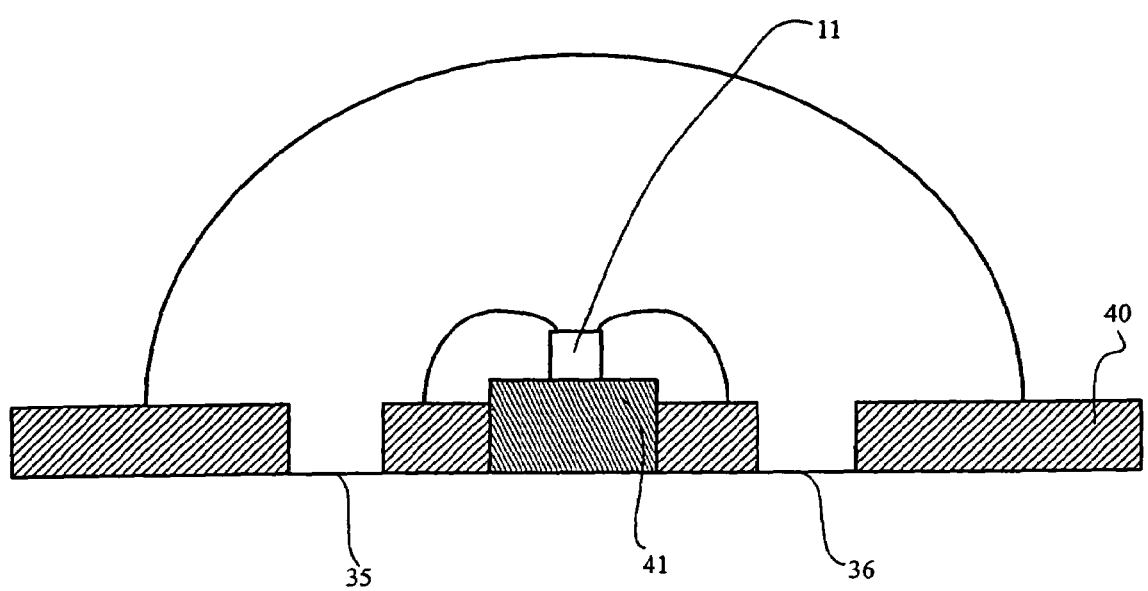
FIG. 7 illustrates an exemplary optical light engine fabricated according to an embodiment of the present invention.

One having ordinary skill in the art will appreciate that the mounting pedestal 41 may also be fitted so that it is retained in the opening in the base 40 rather than extending from underneath such base 40, as shown in FIG. 7. The mounting pedestal 41 may be retained in the aperture by methods known in the art including, but without limitation, using an adhesive or by soldering. Alternatively, the mounting pedestal 41 may be secured in the base 40 using a suitable mechanical locking means to hold the mounting pedestal 41 in place over a variety of environmental conditions, such as temperature changes and mechanical stresses (printed wiring board flexure).

According to an embodiment of the present invention, the mounting pedestal 41 and the aperture of the base 40 may be shaped and dimensioned such that the mounting pedestal 41 may be pressed into the base 40 to form a secure friction fit.

According to another embodiment, the perimeter edges of the aperture may be plated or lined with a solderable material. The mounting pedestal 41 may be pressed into the aperture and heated (to approximately 250° C.) causing the solder to flow and bond the mounting pedestal 41 to the base 40.

According to yet another embodiment, the mounting pedestal 41 may be peened and the peened mounting pedestal 41 may be fitted within the aperture of the base 40. Next, a peening tool may be used to mechanical stretch the perimeter of the mounting pedestal 41 such that the mounting pedestal 41 is forced into the sides of the aperture and locked in place.

One having ordinary skill in the art will appreciate that the mounting pedestal 4 41 may be inserted and fixed within the base 40 using any combination of the techniques described above or otherwise known in the art.

One having ordinary skill in the art will further appreciate that the light engine may include more than one heat sink 42, and each such heat sink 42 may include more than one mounting pedestal 41. Moreover, more than one LED die 11 may be attached to each of the mounting pedestals 41.

As shown in FIG. 4, the base 40 and the heat sink 42 include the one or more ports 35, 36. These ports 35, 36 allow the molding material (e.g., silicone) to flow into and out of a mold cavity to form the substantially hemispherical dome 31 over the one or more LED die 11.

Optionally, the heat spreader 42 may have one or more mounting holes (advantageously with threads 43) for accepting screws, bolts or other similar fasteners 44, to attach the heat spreader 42 to a heat sink (not shown). Optionally, at least a portion of a top surface 45 of the mounting pedestal 41 may be plated or sputtered with reflective metal, such as, for example, aluminum or silver, to enhance reflectivity.

One having ordinary skill in the art will appreciate that the heat spreader 42 and the mounting pedestal 41 may be fabricated as one piece, or, alternatively, the heat spreader 42 may be fabricated as a flat metal plate with a separate elevated mounting pedestal 41 attached to the heat spreader 42 by solder, adhesive, screws, or other similar fastening means.

Figure 5:
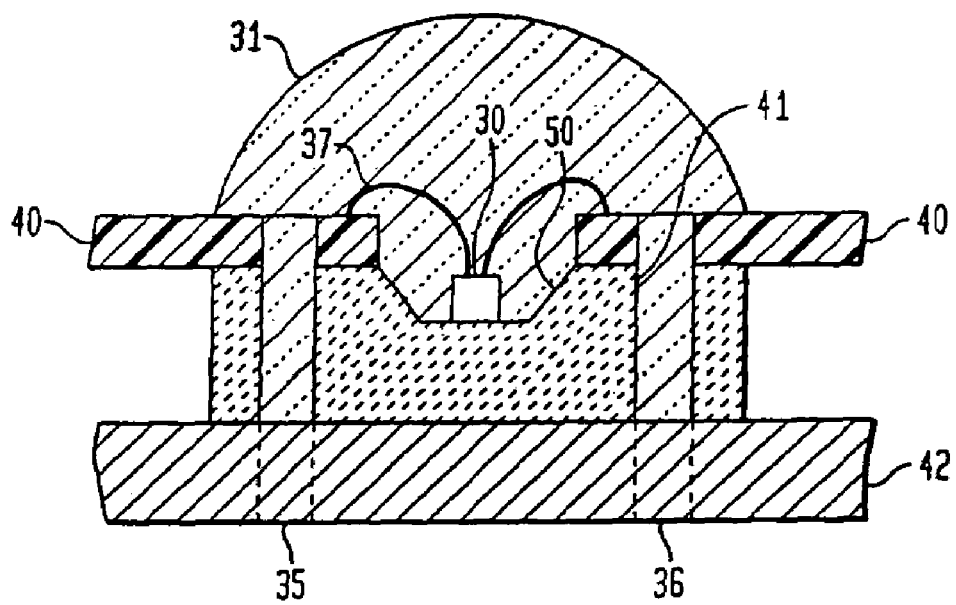
FIG. 5 illustrates an exemplary optical light engine fabricated according to an embodiment of the present invention.

FIG. 5 illustrates another embodiment of a light engine according to the present invention, wherein the light engine includes a pedestal 41 having a recessed surface cavity 50 where one or more LED die 30 may be disposed. The surface cavity 50 may be positioned below the approximate center of a dome 31 (as shown in FIG. 5). Alternatively, the recessed surface cavity 50 may be positioned at or near a top of an elevated mounting pedestal (not shown in FIG. 5). Although the dome 31 is depicted in FIG. 5 as having a generally hemispherical shape, it is to be appreciated that alternative shapes may be selected, depending on the radiation pattern desired. As described above, the mounting pedestal 41 and the heat spreader 42 may be fabricated as one piece, or, alternatively, the heat spreader 42 may be fabricated as a flat plate with a separate elevated mounting pedestal 41 attached thereto.

As shown in FIG. 5, the LED die 30 may be electrically connected using any suitable connection means, such as, for example, wire bond 37. Both the base 40 and the heat sink 42 include an input port 35 and an output port 36 to allow the molding material to flow into and out of the mold cavity to form the dome 31.

II. The Fabrication of LTCC-M Substrates

Multilayer ceramic circuit boards are made from layers of green ceramic tapes. A green tape is made from particular glass compositions and optional ceramic powders, which are mixed with organic binders, a dispersant, and solvents, cast into thin sheets and cut to form the tape. Vias are then punched in the tape and are filled with a conductor ink to connect the wiring on one green tape to wiring on another green tape. Wiring patterns can be screen printed onto the tape layers to carry out various functions. The tapes are then aligned, laminated, and fired to remove the organic materials, to sinter the metal patterns, and to densify and crystallize the glasses. This is generally carried out at temperatures below about 1000° C., and preferably from about 750-950° C. The composition of the glasses determines the coefficient of thermal expansion, the dielectric constant and the compatibility of the multilayer ceramic circuit boards to various electronic components. Exemplary crystallizing glasses with inorganic fillers that sinter in the temperature range 700 to 1000° C. are Magnesium Alumino-Silicate, Calcium Boro-Silicate, Lead Boro-Silicate, and Calcium Alumino-Borsilicate.

More recently, metal support substrates (metal boards) have been used to support the green tapes. The metal boards lend strength to the glass-ceramic layers. Moreover since the green tape layers can be mounted on both sides of a metal board and can be adhered to a metal board with suitable bonding glasses, the metal boards permit increased complexity and density of circuits and devices.

In addition, passive and active components, such as resistors, inductors, and capacitors can be incorporated into the circuit boards for additional functionality. In the event optical components, such as LEDs are installed, the walls of the ceramic layers may be shaped and/or coated to enhance the reflective optical properties of the package. Thus this system, known as low temperature co-fired ceramic-metal support boards, or LTCC-M, has proven to be a means for high integration of various devices and circuitry in a single package. The system can be tailored to be compatible with devices including silicon-based devices, indium phosphide-based devices and gallium arsenide-based devices, for example, by proper choice of the metal for the support board and of the glasses in the green tapes.

The ceramic layers of the LTCC-M structure must be matched to the thermal coefficient of expansion of the metal support board. Glass ceramic compositions are known that match the thermal expansion properties of various metal or metal matrix composites. The LTCC-M structure and materials are described in U.S. Pat. No. 6,455,930, issued Sep. 24, 2002. U.S. Pat. No. 6,455,930 is incorporated by reference herein. The LTCC-M structure is further described in U.S. Pat. Nos. 5,581,876, 5,725,808, 5,953,203, and 6,518,502, all of which are incorporated by reference herein.

The metal support boards used for LTCC-M technology do have a high thermal conductivity, but some metal boards have a high thermal coefficient of expansion, and thus a bare LED die cannot always be directly mounted to such metal support boards. However, some metal support boards are known that can be used for such purposes, such as metal composites of copper and molybdenum (including from 10-25% by weight of copper) or copper and tungsten (including 10-25% by weight of copper), made using powder metallurgical techniques. Copper clad Kovar®, a metal alloy of iron, nickel, cobalt and manganese, a trademark of Carpenter Technology, is a very useful support board. AlSiC is another material that can be used for direct attachment, as can aluminum or copper graphite composites.

Figure 6:
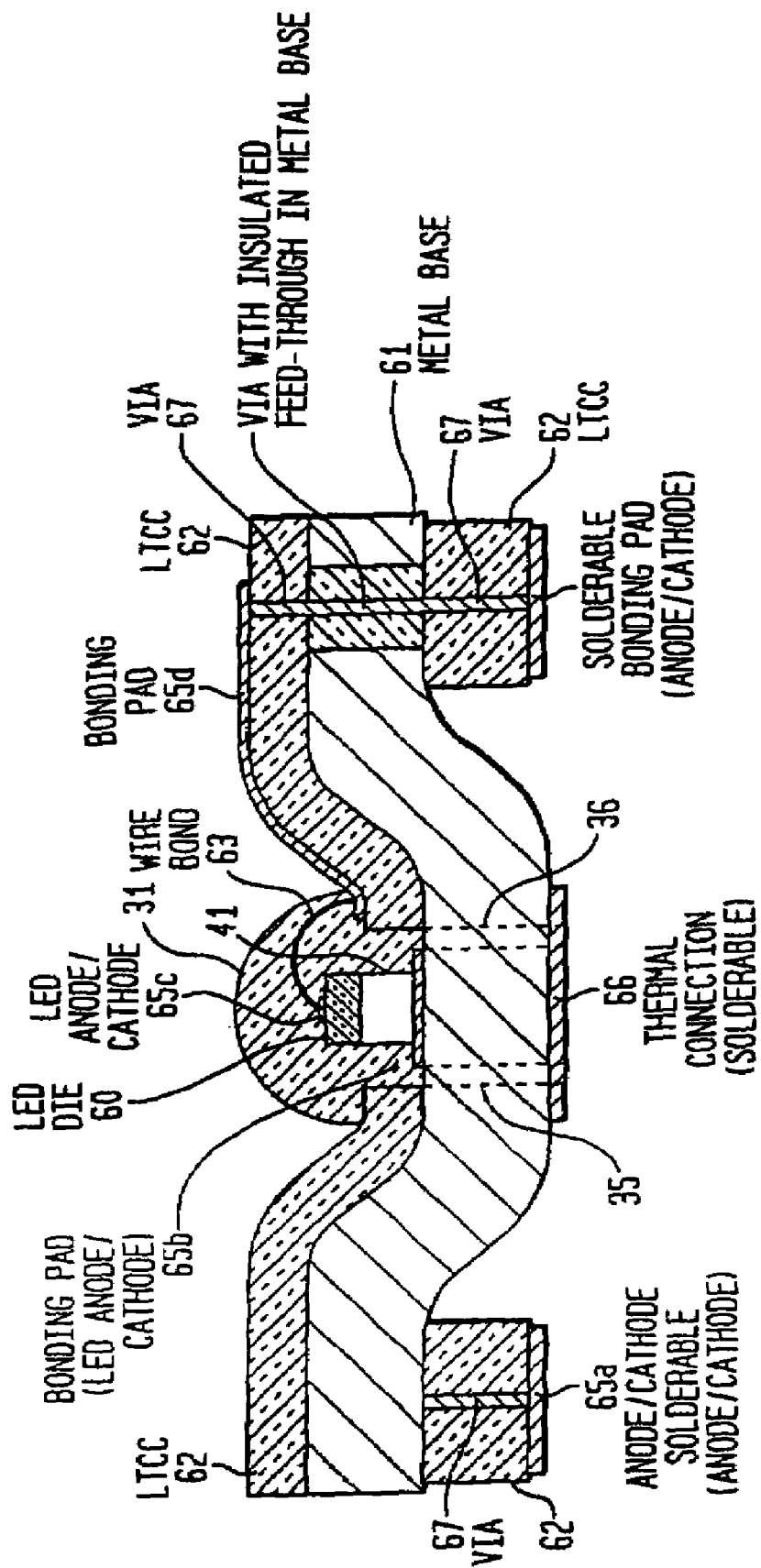
FIG. 6 illustrates an optical light engine including LTCC-M mounting structures, according to an embodiment of the present invention.

In the simplest form, LTCC-M technology is used to provide an integrated package for an LED die and accompanying circuitry, wherein the conductive metal support board provides a heat sink for the component. Referring to FIG. 6, a bare LED die 60, for example, may be mounted onto a pedestal 41 overlying a metal base 61 of the LTCC-M system having high thermal conductivity to cool the semiconductor component. One having ordinary skill in the art will appreciate that the LED die 60 are electrically connected to the ceramic layer 62 using, for example, a wire bond 63, as shown in FIG. 6. Optionally, indirect attachment to the metal base 61 may also be used.

The input port 35 and the output port 36 permit the injection and removal, respectively, of a transparent encapsulating material (e.g., a polymer) used to form the dome 31. According to an embodiment of the present invention, additional components may be mounted on the metal base 61 (e.g., electrodes 65A, 65C, bonding pads 65B, 65D, and thermal connector pads 66) and conductive vias 67 may be disposed through the metal base 61 and the multilayer ceramic portion 62 to connect the various components (e.g., semiconductor components, circuits, heat sink and the like), to form an integrated package. Optionally, the integrated package may be hermetically sealed with a lid (not shown).

According to an embodiment of the present invention, the integrated package may combine a first and a second LTCC-M substrate. The first substrate may have mounted thereon a semiconductor device and a multilayer ceramic circuit board with embedded circuitry for operating the component. The second substrate may include a heat sink or conductive heat spreader mounted thereon. Thermoelectric (TEC) plates (Peltier devices) and temperature control circuitry are mounted between the first and second substrates to provide improved temperature control of semiconductor devices. Optionally, a hermetic enclosure may be attached to the metal support board.

The use of LTCC-M technology may also utilize the advantages of flip chip packaging together with integrated heat sinking. The packages of the invention can be made smaller, cheaper and more efficient than existing present-day packaging. The metal substrate serves as a heat spreader or heat sink. The flip chip may be mounted directly on the metal substrate, which is an integral part of the package, eliminating the need for additional heat sinking. A flexible circuit can be mounted over the bumps on the flip chip. The use of multilayer ceramic layers can also accomplish a fan-out and routing of traces to the periphery of the package, further improving heat sinking. High power integrated circuits and devices that have high thermal management needs may be used with this new LTCC-M technology.

According to an embodiment of the present invention, a light emitting diode packaged for improved light collimation comprising a substrate-supported LED die encapsulated within a transparent encapsulant. The packaged LED die includes a reflecting structure circumscribing and overlying the LED die to reflect back to the LED die light that is laterally emitted from the LED die. The region overlying the LED die is substantially free of light reflecting material and permits exit of light over a reduced angular extent. Advantageously, the reflecting structure comprises a region of the encapsulant coated with reflective material. Also advantageously, the reflecting structure comprises a transparent dome overlying the LED die, a portion of the dome circumscribing the LED die coated with reflecting material. Additionally, although the transparent dome may comprise the encapsulant, one having ordinary skill in the art will appreciate that the dome may be an added component.

The LED die is advantageously roughened to provide a dispersive surface and polished or coated to reflect. In a particularly advantageous embodiment, the substrate-supported LED die comprises a ceramic-coated metal substrate, and the LED die is mounted in a surface cavity formed by an opening in the ceramic.

Figure 8:
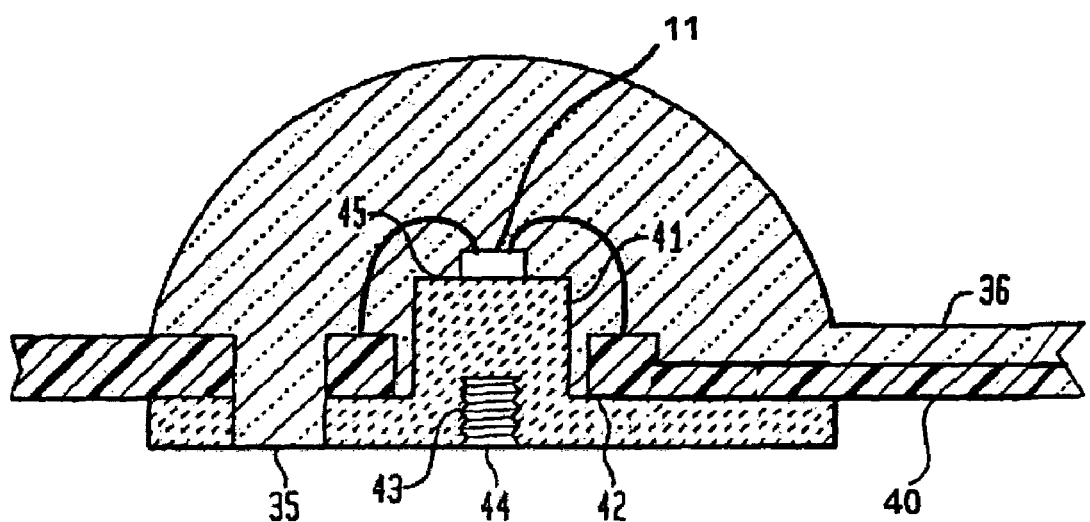
FIG. 8 illustrates an exemplary optical light engine including an output port fabricated according to an embodiment of the present invention.

FIG. 8 illustrates an embodiment of the present invention, wherein at least a portion of the output port 36 is disposed upon and/or substantially parallel to the top surface of the base 40. According to this embodiment, the end of the output port 36 may be open to allow for removal of the excess molding material. Optionally, the end of the output port 36 may be substantially closed, such that the output port 36 acts as a reservoir for the excess encapsulant material. Optionally, the output port 36 may include a vent (not shown), preferably back into the mold.

It is understood that the above-described embodiments are illustrative of only a few of the many possible specific embodiments, which may represent exemplary applications of the present invention. Numerous and varied other arrangements can be made by those skilled in the art without departing from the scope of the invention.

What is claimed is:

1. An optical light engine comprising:
a base including an input port and an output port, each of the input port and the output port extending from one side of the base to the other side of the base;
a pedestal disposed and adapted to support one or more LED die above a surface of the base;
one or more LED die mounted on the pedestal; and
a dome disposed over one or more of the LED die, the dome comprising a solid form of material having a first integrally formed post disposed substantially within the input port from the one side of the base to the other side, and a second integrally formed post disposed substantially within the output port from the one side of the base to the other side, wherein the solid form of material is in intimate contact with the one or more LED die, the input port and the output port, and wherein the solid form of material is an injection molding material.

2. The optical light engine of claim 1, wherein each of the dome is approximately centered about the pedestal.

3. The optical light engine of claim 1, wherein the base includes one or more layers of ceramic coating having a surface cavity formed therein.

4. The optical light engine of claim 1, wherein the dome is hemispheric.

5. The optical light engine of claim 1, wherein the molding material comprises silicone.

6. The optical light engine of claim 1, wherein the molding material comprises epoxy.

7. The optical light engine of claim 1, wherein the pedestal comprises a thermally conductive material.

8. The optical light engine of claim 1, wherein the base comprises a thermally conductive material.

9. The optical light engine of claim 1, wherein the pedestal comprises a heat sink underlying the base.

10. The optical light engine of claim 9, wherein the base comprises a printed wiring board including an aperture disposed and adapted to allow the pedestal to project therethrough.

11. The optical light engine of claim 1, wherein the pedestal is plated with a reflective material.

12. The optical light engine of claim 1, wherein the base comprises a printed wiring board including an aperture and the pedestal is retained in such aperture so as to be fastened within the base.

13. The optical light engine of claim 1, wherein the pedestal includes a surface cavity wherein the one or more LED die are attached.

14. The optical light engine of claim 1, wherein at least a portion of the output port is substantially parallel to the base.

15. The optical light engine of claim 14, wherein the output port comprises a closed end thereby forming a reservoir for the excess molding material.

16. The optical light engine of claim 1, wherein the pedestal is disposed on top of the base and the one or more LED die is disposed on top of the pedestal.

17. The optical light engine of claim 1, wherein each of the input port and the output port extend completely through the base from one side of the base to the other side of the base creating respective through-holes in the base.

18. The optical light engine of claim 3, wherein the pedestal is mounted within the surface cavity.

19. The optical light engine of claim 3, wherein the pedestal extends above a surface of the base at least as high as a top surface of the one or more ceramic layers.

20. The optical light engine of claim 3, wherein the one or more ceramic layers include metallization and each of the one or more LED die is electrically connected by wire bonding to the metallization.

21. The optical light engine of claim 4, wherein the LED die is mounted on the pedestal at an elevation at an approximate center of the hemispheric dome.

22. The optical light engine of claim 9, wherein the printed wiring board comprises a FR4 material.

23. The optical light engine of claim 12, wherein the printed wiring board comprises a FR4 material.

24. The optical light engine of claim 12, wherein the pedestal comprises a Cu/Mo/Cu alloy.

25. An optical light engine array comprising:
  a common base including one or more input ports and one or more output ports, each of the one or more input ports and the one or more output ports extending from one side of the common base to the other side of the common base creating respective through-holes in the common base;
  at least one pedestal supported by the common base:
  an LED die mounted on each of the at least one pedestal such that each respective LED die is positioned above an upper surface of the common base; and
  a dome disposed over each respective one of the at least one pedestal, each respective dome comprising a solid form of material having a first integrally formed post disposed substantially within at least one of the input ports from the one side of the base to the other side, and a second integrally formed post disposed substantially within at least one of the output ports from the one side of the base to the other side, wherein the solid form of material is in intimate contact with the respective LED die, the respective input port, and the respective output port, and wherein the solid form of material is an injection molding material;
  wherein each respective LED die is elevated by the pedestal to an approximate center of the dome.

26. An optical light engine comprising:
  a base including an input port and an output port, each of the input port and the output port extending from one side of the base to the other side of the base;
  a pedestal supported by the base;
  an LED die mounted on the pedestal; and
  a dome disposed over one or more of the LED die, the dome comprising a solid form of material having a first integrally formed post disposed substantially within the input port, and a second integrally formed post disposed substantially within the output port, wherein the solid form of material is in intimate contact with the one or more LED die, the input port and the output port, and wherein the solid form of material is an injection molding material;
  wherein the LED die is mounted on the pedestal at an elevation such that the LED die is elevated to approximately the center of the dome.

* * * * *